United States Patent
Olney

(10) Patent No.: US 9,432,133 B2
(45) Date of Patent: Aug. 30, 2016

(54) VECTOR SIGNAL GENERATOR CHANNEL CHARACTERIZATION EMPLOYING ORTHOGONAL MODULATION

(71) Applicant: Keysight Technologies, Inc., Minneapolis, MN (US)

(72) Inventor: Douglas Olney, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/613,223

(22) Filed: Feb. 3, 2015

(65) Prior Publication Data

US 2016/0226605 A1    Aug. 4, 2016

(51) Int. Cl.
| | | |
|---|---|---|
| H04L 1/20 | (2006.01) | |
| H04W 24/06 | (2009.01) | |
| H04B 17/309 | (2015.01) | |
| H04L 5/00 | (2006.01) | |
| H04L 1/24 | (2006.01) | |
| G01R 23/20 | (2006.01) | |
| H04L 5/06 | (2006.01) | |

(52) U.S. Cl.
CPC ............. *H04B 17/309* (2015.01); *G01R 23/20* (2013.01); *H04L 1/242* (2013.01); *H04L 5/0007* (2013.01)

(58) Field of Classification Search
CPC .............. H04L 1/242; H04L 27/2602; H04L 27/2601; H04L 5/0007; G01R 23/20; H04B 17/309
See application file for complete search history.

(56) References Cited

U.S. PATENT DOCUMENTS

| | | | |
|---|---|---|---|
| 6,028,888 A | 2/2000 | Roux | |
| 6,625,111 B1* | 9/2003 | Sudo | H04L 27/2602 370/203 |
| 6,747,946 B1* | 6/2004 | Kaneko | H04L 27/263 370/206 |
| 7,564,896 B2 | 7/2009 | Olgaard | |
| 7,822,130 B2* | 10/2010 | Walvis et al. | 375/260 |
| 8,238,463 B1* | 8/2012 | Arslan | H04L 1/0606 375/267 |
| 2002/0082792 A1* | 6/2002 | Bourde | G01R 27/32 702/107 |
| 2002/0118834 A1* | 8/2002 | Wilson | H04N 7/167 380/222 |
| 2003/0227867 A1* | 12/2003 | Xiong | H04L 27/2602 370/210 |
| 2013/0230328 A1* | 9/2013 | Fan | H04B 10/2575 398/115 |
| 2014/0169508 A1* | 6/2014 | Wei | H04L 27/265 375/343 |

OTHER PUBLICATIONS

Necker, M.C.; Stuber, G.L., "Totally blind channel estimation for OFDM on fast varying mobile radio channels," Wireless Communications, IEEE Transactions on, vol. 3, No. 5, pp. 1514,1525, Sep. 2004.*

* cited by examiner

*Primary Examiner* — Chieh M Fan
*Assistant Examiner* — Michelle M Koeth

(57) ABSTRACT

Multichannel signal generator performance characterization employs orthogonal modulation to characterize a relative performance of channels of a multichannel signal generator. The performance characterization includes generating a first signal in a first channel of the multichannel signal generator and generating a second signal in a second channel of the multichannel signal generator. The first and second signals include an orthogonal frequency-division multiplexing (OFDM) digital modulation having a first set of subcarriers assigned to the first signal and a second set of subcarriers assigned to the second signal. Performance characterization further includes combining the first signal and the second signal to produce a combined signal along with receiving and demodulating the combined signal according to the OFDM digital modulation using a digital receiver and determining a performance parameter of the second channel relative to the first channel from the received and demodulated combined signal.

18 Claims, 3 Drawing Sheets

VECTOR SIGNAL GENERATOR CHANNEL CHARACTERIZATION EMPLOYING ORTHOGONAL MODULATION

CROSS-REFERENCE TO RELATED APPLICATIONS

N/A

STATEMENT REGARDING FEDERALLY SPONSORED RESEARCH OR DEVELOPMENT

N/A

BACKGROUND

Many modern systems including, but not limited to, wireless communications systems and various related data communications networks frequently employ a vector signal generator in one form or another. In particular, vector signal generators are often critical elements of a test and measurement system when testing, validating or otherwise characterizing system performance of such systems. For example, a vector signal generator may be used to generate signals having one or more specific modulation formats to test a receiver used by a wireless data communications system. Vector signal generators may also be used to characterize a data channel or pathway or to assess and validate the operational status of a transmitter. Other applications of vector signal generators, especially multichannel vector signal generators, include, but are not limited to, multiple input multiple output (MIMO) systems.

BRIEF SUMMARY

In some embodiments, a method of characterizing multichannel signal generator performance employing orthogonal modulation is provided. The method of characterizing comprises generating a first signal in a first channel of a multichannel signal generator. The method of characterizing further comprises generating a second signal in a second channel of the multichannel signal generator. The first and second signals comprise an orthogonal frequency-division multiplexing (OFDM) digital modulation having a first set of subcarriers assigned to the first signal and a second set of subcarriers assigned to the second signal. The method of characterizing further comprises combining the first signal and the second signal to produce a combined signal, and receiving and demodulating the combined signal according to the OFDM digital modulation using a digital receiver. The method of characterizing further comprises determining a performance parameter of the second channel relative to the first channel from the received and demodulated combined signal.

In some embodiments, a vector signal generator performance characterization system is provided. The vector signal generator performance characterization system comprises a vector signal generator (VSG) configured to produce a first signal in a first VSG channel and a second signal in a second VSG channel. The first and second signals comprise an orthogonal frequency-division multiplexing (OFDM) digital modulation having a first set of subcarriers assigned to the first signal and a second set of subcarriers assigned to the second signal.

In some embodiments, a non-transitory computer readable medium is provided. The non-transitory computer readable medium is encoded with instructions that, when executed by a processor, implement multichannel signal generator channel performance characterization. The implemented multichannel signal generator channel performance characterization comprises generating a first signal in a first channel of a multichannel signal generator (MSG) and generating a second signal in a second channel of the multichannel signal generator. The implemented multichannel signal generator channel performance characterization further comprises receiving and demodulating a combined signal according to an orthogonal modulation (e.g., an orthogonal frequency-division multiplexing (OFDM) digital modulation) using a digital receiver, the combined signal comprising the first and second signals. The implemented multichannel signal generator channel performance characterization further comprises determining a performance parameter of the second channel relative to the first channel using the received and demodulated combined signal.

BRIEF DESCRIPTION OF THE DRAWINGS

Various features of embodiments and examples in accordance with the principles described herein may be more readily understood with reference to the following detailed description taken in conjunction with the accompanying drawings, where like reference numerals designate like structural elements, and in which.

Figure 1:
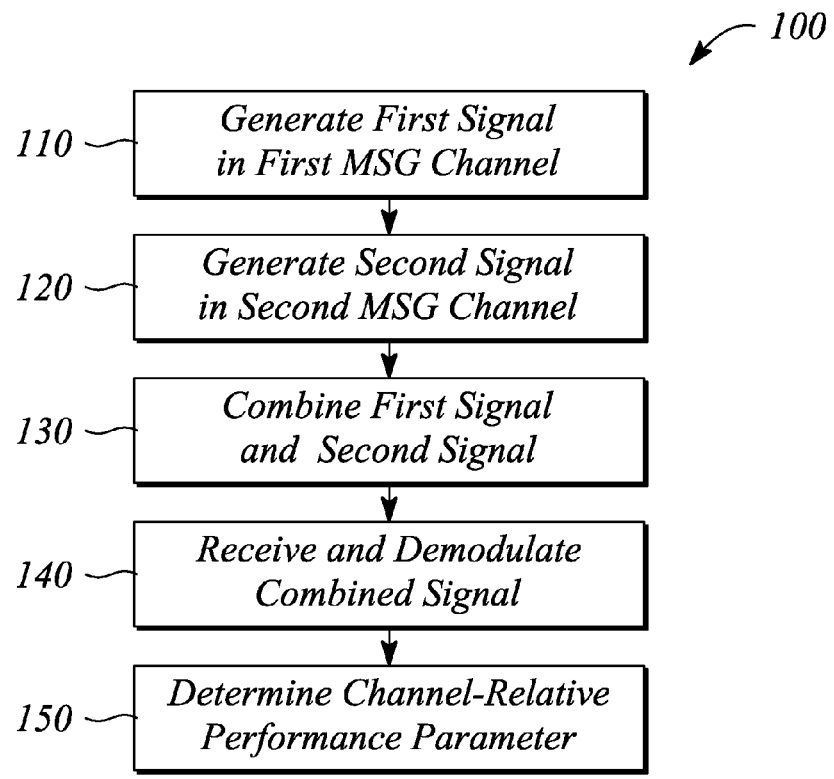
FIG. 1 illustrates a flow chart of a method of characterizing multichannel signal generator performance employing orthogonal modulation in an example, according to an embodiment consistent with the principles described herein.

Certain examples and embodiments have other features that are one of in addition to and in lieu of the features illustrated in the above-referenced figures. These and other features are detailed below with reference to the above-referenced figures.

DETAILED DESCRIPTION

Embodiments and examples consistent with the principles described herein provide relative channel performance characterization of a multichannel signal generator. In particular, relative channel performance (i.e., channel-to-channel performance) is determined using signals generated in channels of the multichannel signal generator where each signal includes an orthogonal modulation. The multichannel signal generator may be a vector signal generator, for example. The orthogonal modulations facilitate separating and characterizing the signals produced by the multichannel signal generator. According to various embodiments, the orthogonal modulation comprises orthogonal frequency-division multiplexing (OFDM) digital modulation having subcarriers that generally span a bandwidth of interest. Moreover, according to some embodiments, the provided relative channel characterization is accomplished using a single channel of a digital receiver (e.g., a single channel vector signal analyzer).

Characterization of channel-to-channel performance or 'relative channel performance' of a multichannel vector signal generator may be accomplished using an oscilloscope. However, performance characterization precision and accuracy are generally limited by noise and distortion of the oscilloscope. For example, for a signal having a one-hundred sixty megahertz (160 MHz) bandwidth, it may be difficult to accurately measure relative delay of a pair of channels of a multichannel vector signal generator to better than about one nanosecond (1 ns) using an oscilloscope. Moreover, when the multichannel vector signal generator operates at radio frequencies (RF), the cost of the oscilloscope can be high. Embodiments according to the principles described herein may provide precise, accurate measurements of relative channel performance of a multichannel signal generator. Moreover, the precision and accuracy may be better than is possible otherwise, according to various embodiments, and possibly with little impact on equipment cost.

Herein, vector signal generators, also known as digital signal generators, are defined as substantially any device, apparatus or system that produces or is capable of producing a digitally modulated signal. For example, a vector signal generator may be capable of generating digitally modulated radio frequency (RF) signals having any of a large number of digital modulations formats including, but not limited to, quadrature amplitude modulation (QAM), binary phase shift keying (BPSK), quadrature phase shift keying (QPSK), frequency shift keying (FSK), and orthogonal frequency-division multiplexing (OFDM) modulation. Further herein, a 'multichannel' vector signal generator or more generally, a multichannel signal generator, is a digital signal generator that produces or is capable of producing a plurality of different, digitally modulated signals in parallel. In particular, the plurality of digitally modulated signals may be produced in a substantially simultaneous manner in parallel in a similar plurality of different channels by the multichannel vector signal generator, by definition herein. A multichannel vector signal generator may be a single apparatus, for example, or the multichannel vector signal generator may comprise a plurality of vector signal generators configured to function as a multichannel vector signal generator, by definition herein. An example of a vector signal generator is a M9381A PXIe RF Vector Signal Generator manufactured by Keysight Technologies of Santa Rosa, Calif.

Embodiments implementing the relative channel performance characterization of a multichannel signal generator consistent with the principles described herein may be implemented using a variety of devices and circuits including, but not limited to, integrated circuits (ICs), very large scale integrated (VLSI) circuits, application specific integrated circuits (ASIC), field programmable gate arrays (FPGAs) and the like, firmware, software, or a combination of two or more of the above. For example, elements or 'blocks' of an implementation consistent with the principles described herein may all be implemented as circuit elements within an ASIC or a VLSI circuit. Implementations that employ an ASIC or a VLSI circuit are examples of hardware-based circuit implementation, for example. In another example, the entire apparatus may be implemented as software using a computer programming language (e.g., C/C++) or software-based modeling environment (e.g., Matlab®, MathWorks, Inc., Natick, Mass.). Implementation of the entire apparatus as software is an example of a purely software implementation. In yet another example, some of the blocks may be implemented using actual circuitry (e.g., as an IC or an ASIC) while other blocks may be implemented in software or firmware.

Herein, a 'non-transitory computer readable medium' is defined as substantially any data storage medium that provides non-transitory storage of information that may be read or otherwise utilized by a computer. For example, computer readable memory including, but not limited to, random access memory (RAM), read-only memory (ROM), programmable or erasable ROM, or flash memory (e.g., a thumb drive) are each a non-transitory computer readable medium, by definition herein. Other examples of non-transitory computer readable medium include, but are not limited to, various types of magnetic disks and disk drives (e.g., a hard disk drive, a floppy disk drive, a floppy diskette, etc.), and various optical discs and disc drives (e.g., CD, CD-R, CD-RW, DVD, etc.), by definition herein. In addition, network attached storage, so-called 'cloud' storage (e.g., remote data storage accessible via the Internet), or various other types of computer readable medium used by modern computing systems may be non-transitory computer readable medium, by definition herein.

Further, as used herein, the article 'a' is intended to have its ordinary meaning in the patent arts, namely 'one or more'. For example, 'a channel' means one or more channels and as such, 'the channel' means 'the channel(s)' herein. Also, any reference herein to 'top', 'bottom', 'upper', 'lower', 'up', 'down', 'front', back', 'first', 'second', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount within a range of about 51% to about 100%, for example. Moreover, examples herein are intended to be illustrative only and are presented for discussion purposes and not by way of limitation.

In accordance with some embodiments of the principles described herein, a method of characterizing multichannel signal generator performance employing orthogonal modulation is provided. FIG. 1 illustrates a flow chart of a method 100 of characterizing multichannel signal generator performance employing orthogonal modulation in an example, according to an embodiment consistent with the principles described herein. In particular, inter-channel performance of a multichannel signal generator may be characterized, according to various embodiments. For example, the method 100 may be used to measure or characterize performance of a first channel relative to a second channel of the multichannel signal generator. In some embodiments, the method 100 of characterizing multichannel signal generator performance illustrated in FIG. 1 may be used to characterize the performance (e.g., one or more of to test, calibrate, adjust, or etc.) a multichannel signal generator such as, but not limited to, a dual channel vector signal generator (VSG), or a multichannel VSG having more than two channels. In other examples, the multichannel signal generator may comprise a plurality of signal generators (e.g., single channel VSGs) combined together as the multichannel signal generator. In yet other examples, the multichannel signal generator may be a specialized apparatus or system for generating a plurality of signals using separate channels including, but not limited to, a multiple input, multiple output (MIMO) test system.

According to various embodiments, the method 100 of characterizing multichannel signal generator performance comprises generating 110 a first signal in a first channel of a multichannel signal generator. The method 100 of characterizing further comprises generating 120 a second signal in a second channel of the multichannel signal generator. For example, the multichannel signal generator may be programmed with characteristics (e.g., modulation, frequency, etc.) of the first and second signals. Then the multichannel signal generator may be commanded to begin generating 110, 120 the first and second signals according to the programming. In some examples, the first and second signals may be generated 110, 120 simultaneously by the multichannel signal generator.

According to various embodiments, the second signal has a modulation that is orthogonal to a modulation of the first signal. In particular, the generated 110, 120 first signal and the second signal comprise an orthogonal frequency-division multiplexing (OFDM) digital modulation, according to various embodiments. Further, according to various embodiments, the OFDM digital modulation has a first set of subcarriers assigned or allocated to the first signal and a second set of subcarriers assigned or allocated to the second signal. That is, generating 110 the first signal comprises producing modulated OFDM subcarriers within the first set of subcarriers using the first channel of the multichannel signal generator. Similarly, generating 120 the second signal comprises producing modulated OFDM subcarriers within the second subcarrier set using the second channel of the multichannel signal generator.

According to some embodiments, the subcarriers of the first subcarrier set are interleaved with the subcarriers of the second subcarrier set. That is, in terms of frequency, a subcarrier of the second subcarrier set is located between a pair of subcarriers of the first subcarrier set in the frequency domain, and a subcarrier of the first subcarrier set is between a pair of subcarriers of the second subcarrier set. In particular, modulated OFDM subcarriers produced by generating 110 the first signal using the first channel of the multichannel signal generator (i.e., the first subcarrier set) may be distributed across or among subcarrier frequencies of the OFDM digital modulation, according to various embodiments. In addition, modulated OFDM subcarriers produced by generating 120 the second signal using the second channel of the multichannel signal generator (i.e., the second subcarrier set) may be distributed across or among other subcarrier frequencies of the OFDM digital modulation, where the other subcarrier frequencies corresponding to the second signal are in between the subcarrier frequencies corresponding to the first signal (i.e., subcarriers of the first subcarrier set).

Figure 2A:
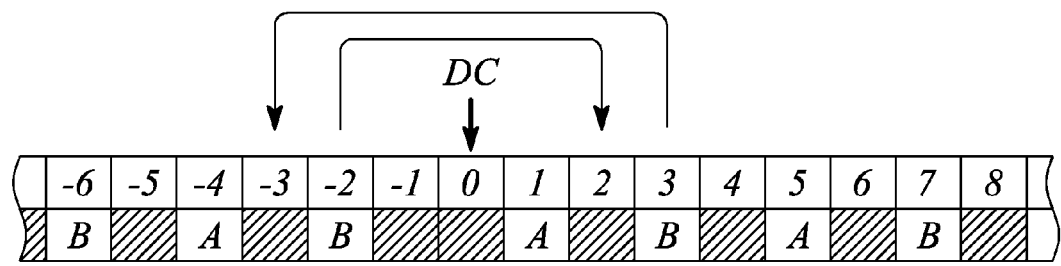
FIG. 2A illustrates a portion of a frequency plan of an OFDM digital modulation in an example, according to an embodiment consistent with the principles described herein.

FIG. 2A illustrates a portion of a frequency plan of an OFDM digital modulation in an example, according to an embodiment consistent with the principles described herein. The frequency plan illustrated in FIG. 2A is a table that includes a top row corresponding to subcarriers of the OFDM digital modulation and a bottom row corresponding to a channel or signal assignment of particular subcarriers. Further, as illustrated, the frequency plan includes interleaved first and second subcarrier sets assigned or allocated to the first and second signals, respectively. In particular, the OFDM digital modulation comprises a plurality of subcarriers distributed in frequency (e.g., as frequency slots or bands) around a central subcarrier that is arbitrarily labeled with zero (0), as illustrated. Subcarriers above the central subcarrier (i.e., to the right of the central subcarrier in FIG. 2A) are sequentially labeled using positive integers starting at one (i.e., 1, 2, 3, . . . ) in the top row. Subcarriers below the central subcarrier (i.e., to the left of the central subcarrier in FIG. 2A) are labeled sequentially using negative integers starting at minus one (i.e., −1, −2, −3, . . . ) in the top row. Subcarriers at frequencies below the central subcarrier (i.e., labeled with negative integers in FIG. 2A) are referred to as 'negative frequency subcarriers,' while 'positive frequency subcarriers' are subcarriers at frequencies above the central subcarrier (i.e., labeled with positive integers in FIG. 2A), by definition herein. The plurality of subcarriers of the frequency plan illustrated in FIG. 2A may be illustrative of an OFDM digital modulation produced using a one-hundred twenty-eight (128) point fast Fourier transform (FFT), by way of example and not limitation. Other FFTs may be used including, but not limited to, a sixty-four (64) point FFT, a two-hundred fifty-six (256) point FFT, or so on. The central subcarrier may also be referred to as the 'DC' subcarrier since the central subcarrier may correspond to 'DC' or 'zero frequency' of a signal baseband prior to modulation using the OFDM digital modulation, according to some embodiments. The central or DC subcarrier is also indicated by the bold arrow in FIG. 2A.

In the bottom row of FIG. 2A, subcarriers of the first subcarrier set assigned to a first channel (i.e., channel A in this example) of the multichannel signal generator are labeled 'A' and subcarriers assigned to a second channel (i.e., channel B in this example) are labeled 'B'. As illustrated in FIG. 2A, the subcarriers of the first and second subcarrier sets are interleaved. In particular, a subcarrier labeled 'A' is between a pair of subcarriers labeled 'B' and a subcarrier labeled 'B' is between a pair of subcarriers labeled 'A', as illustrated. Further, in FIG. 2A, the central subcarrier (the DC subcarrier) is not assigned to either the first channel or the second channel of the multichannel signal generator. According to some embodiments, the central subcarrier is not assigned to a channel of the multichannel signal generator, since various unwanted signals components and distortions may tend to accumulate at DC. Not assigning the central subcarrier to a multichannel signal generator channel may avoid corruption of the generated 110, 120 first and second signals caused by these unwanted signal components and distortions, for example.

According to some embodiments, a subcarrier of the first subcarrier set is separated from a subcarrier of the second subcarrier set by an unused subcarrier. For example, every other subcarrier of the OFDM digital modulation may remain unused or unassigned to any channel of the multichannel signal generator, according to some embodiments. FIG. 2A illustrates unused subcarriers between each pair of used or assigned subcarriers. Unassigned subcarriers in FIG. 2A are crosshatched to emphasize that these subcarriers are unused. In particular, in FIG. 2A, odd numbered positive subcarriers (e.g., subcarriers 1, 3, 5, . . . ) are assigned as alternating between the channel A and the channel B, while even numbered positive subcarriers (e.g., subcarriers 2, 4, 8, . . . ) are unused (or unassigned), as illustrated. Unused subcarriers between subcarriers that are assigned to a multichannel signal generator channel may minimize signal corruption or degradation due to a common form of distortion observed or found in typical signal generators such as the multichannel signal generator.

According to some embodiments, negative frequency subcarriers of the first and second subcarrier sets are offset from corresponding positive frequency subcarriers. By 'offset' it is meant that a negative frequency subcarrier is unused or unassigned when a corresponding positive frequency subcarrier is assigned to a channel of the multichannel signal generator. For example, if odd numbered positive frequency subcarriers are used, then odd numbered negative frequency subcarriers may be unused. As illustrated in FIG. 2A, a negative frequency subcarrier (e.g., subcarrier −3) may be unused when a corresponding positive frequency subcarrier (e.g., subcarrier 3) is assigned to a channel of the multichannel signal generator (e.g., channel B).

Offsetting corresponding used and unused subcarriers of the respective positive and negative frequency subcarriers further may minimize signal corruption or degradation due to common forms of distortion in typical signal generators such as the multichannel signal generator. For example, energy from a particular positive (or negative) frequency subcarrier may leak over to a corresponding negative (or positive) frequency subcarrier. Examples of energy leakage is illustrated in FIG. 2A (e.g., arrows from positive frequency subcarrier 3 to negative frequency subcarrier −3 and also from negative frequency subcarrier −2 to positive frequency subcarrier 2). Offsetting negative frequency subcarriers of the first and second subcarrier sets (i.e., used negative frequency subcarriers) from positive frequency subcarriers of the first and second subcarrier sets (i.e., used positive frequency subcarriers) reduces, and in some embodiments minimizes, an effect of the energy leakage between positive frequency subcarriers and negative frequency subcarriers, according to some embodiments.

In some embodiments, a selected pair of adjacent subcarriers of the OFDM digital modulation may be assigned to either the first channel or the second channel of the multichannel signal generator. Alternatively, respective selected pairs of adjacent subcarriers of the OFDM digital modulation may be assigned to the first channel and the second channel of the multichannel signal generator. One or both of assigning the adjacent subcarrier pair to the first channel and assigning another adjacent subcarrier pair to the second channel may facilitate phase unwrapping (e.g., resolving a phase ambiguity), according to some embodiments. In particular, assigning a pair of adjacent subcarriers to the same multichannel signal generator channel minimizes a frequency difference between two subcarriers assigned to the same multichannel signal generator channel. The minimized frequency difference may assist in phase unwrapping to produce a relative carrier phase measurement (as further described herein).

In some embodiments, the adjacent subcarrier pair (each subcarrier of the pair having the same channel assignment) is located near to a band edge of the OFDM digital modulation. For example, the same channel-assigned adjacent subcarrier pair may be located at or near a lower OFDM band edge (i.e., a negative frequency band edge). In another example, the same channel-assigned adjacent subcarrier pair may be located at or near an upper OFDM band edge (i.e., a positive frequency band edge).

In some embodiments, a portion of the subcarriers at one or both of the lower and upper OFDM band edges are unused or unassigned to a multichannel signal generator channel. For example, about one percent (1%), or about five percent (5%), or about ten percent (10%) of the OFDM band edge subcarriers may be unused or unassigned. The unused OFDM band edge subcarriers may be reserved for filtering and band isolation, according to some embodiments. When some of the OFDM band edge subcarriers are unused, the same channel-assigned adjacent subcarrier pairs may be located adjacent to the unused OFDM band edge subcarriers, for example.

Figure 2B:
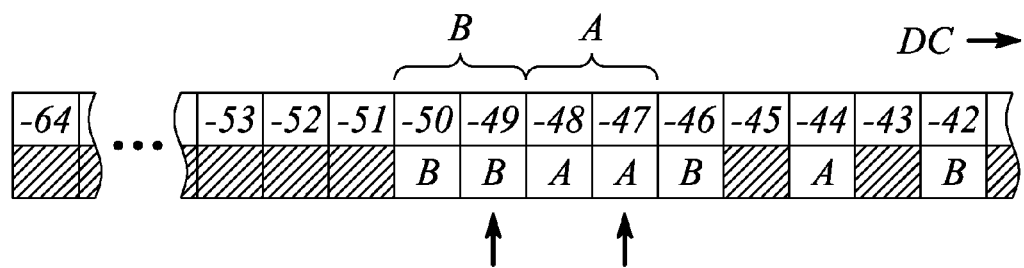
FIG. 2B illustrates another portion of the OFDM digital modulation frequency plan of FIG. 2A in an example, according to an embodiment consistent with the principles described herein.

FIG. 2B illustrates another portion of the OFDM digital modulation frequency plan of FIG. 2A in an example, according to an embodiment consistent with the principles described herein. In particular, FIG. 2B illustrates a portion of the OFDM digital modulation frequency plan at a lower or negative frequency OFDM band edge. Since the example frequency plan in FIGS. 2A and 2B uses a 128-point FFT, the lower OFDM band edge subcarriers are labeled starting from the left at minus sixty-four (−64), as illustrated in FIG. 2B. As illustrated, about 5% of the subcarriers at the OFDM band edges are unused or reserved (i.e., subcarriers −64 through −51 are unassigned). Consistent with FIG. 2A described above, unassigned subcarriers are also cross-hatched in FIG. 2B.

Further in FIG. 2B, a pair of adjacent subcarriers assigned to the second channel (i.e., channel B) of the multichannel signal generator and another pair of adjacent subcarriers assigned to the first channel (i.e., channel A) of the multichannel signal generator are illustrated at (−50, −49) and (−48, −47), respectively. The adjacent subcarrier pairs are delineated with brackets labeled 'A' and 'B', respectively. In addition, subcarriers of each pair corresponding to 'normally' unassigned or unused subcarriers (i.e., −49 and −47) are identified with a bold arrow in FIG. 2B to emphasize that these subcarriers are assigned to a channel in each of the adjacent subcarrier pairs. In the DC direction, i.e., above the same channel-assigned subcarrier pairs illustrated in FIG. 2B, the pattern of subcarrier assignment described for FIG. 2A resumes with subcarrier −45 being unassigned, subcarrier −44 being assigned to channel A, and so on. Note that while illustrated in FIG. 2B as involving the negative frequency or lower OFDM band edge, the discussion herein with respect to the band edge in FIG. 2B applies equally well to other portions of frequency plan including, but not limited to, the positive frequency or upper OFDM band edge.

In some embodiments, an optional optimization may be performed to reduce a length of a waveform and facilitate analysis thereof. In particular, the first and second signals may be generated 110, 120 using OFDM digital modulation without a cyclic prefix. For example, when the first and second signals are constructed or generated 110, 120 using OFDM digital modulation, subcarrier values may be processed with or passed through an inverse-FFT (IFFT) to create a time waveform representing a sum of all of the subcarriers. The time waveform may have a length that is equal to a symbol period (i.e., an inverse of the subcarrier spacing), for example. Unlike in various data communications or broadcast implementations of OFDM, a cyclic extension or 'cyclic prefix' may not be employed in generating 110, 120, according to some embodiments of the principles described herein. Instead, an output of the OFDM digital modulation may be employed directly as the orthogonally modulated first and second signals. As such, the first and second signals may be shorter than similar broadcast OFDM digital modulation signals that include the cyclic prefix. Further, when the cyclic prefix is not used, the first and second signals naturally repeat so that precise triggering may not be necessary to acquire the signals during later processing and precise time alignment may not be needed in vector averaging, described below. Specifically, since each subcarrier, by definition, includes an integer number of cycles in an FFT period, the multichannel signal generator may generate 110, 120 the first and second signals by repeating one FFT period in an loop (e.g., an infinite loop)

to create a substantially seamless waveform without a discontinuity at one or both of a beginning and an end of the FFT period, for example.

Referring again to FIG. 1, the method 100 of characterizing multichannel signal generator performance further comprises combining 130 the first signal and the second signal to produce a combined signal. In particular, in combining 130 the first and second signals, subcarriers of the first subcarrier set generated 110 by or using the multichannel signal generator first channel are combined with subcarriers of the second subcarrier set generated 120 by or using the multichannel signal generator second channel to produce the combined signal. For example, the combined signal may conform to the frequency plan illustrated in FIG. 2A.

Combining 130 the first and second signals may comprise using a power combiner, according to some embodiments. For example, the power combiner may be a passive, equal weighted, power combiner having a pair of inputs and an output. The pair of inputs may be configured to receive the first and second signals (e.g., a first input of the pair to receive the first signal and a second input of the pair to receive the second signal) and the output may be configured to provide the combined signal, for example. The power combiner may be connected to output ports of the multichannel signal generator, in some examples.

As illustrated in FIG. 1, the method 100 of characterizing multichannel signal generator performance further comprises receiving and demodulating 140 the combined signal according to the OFDM digital modulation using a digital receiver. In some embodiments, receiving and demodulating 140 the combined signal comprises digitizing the received combined signal. In some embodiments, the digital receiver may comprise a vector signal analyzer (VSA) connected to receive and digitize the combined signal. In some embodiments, the VSA is a single channel VSA having a single input. The single input of the single channel VSA may be connected to the output of the power combiner, for example. In other embodiments, other digital receivers including, but not limited to, a multichannel VSA, may be used to receive and demodulate 140 the combined signal. For example, one of the channel inputs of the multichannel VSA may be connected to the power combiner output to receive and demodulate 140 the combined signal.

The method 100 of characterizing multichannel signal generator performance illustrated in FIG. 1 further comprises determining 150 a performance parameter of the multichannel signal generator second channel relative to the first channel. In particular, the performance parameter is determined 150 from the received and demodulated 140 combined signal. According to various embodiments, determining 150 a performance parameter comprises computing one or more of a relative time delay, a relative carrier phase, a relative gain and a relative flatness of the first and second channels of the multichannel signal generator from the received and demodulated 140 combined signal. In some examples, determining 150 a performance parameter includes separating the received and demodulated 140 combined signal into representations of the first signal and the second signal using signal processing.

According to some embodiments, determining 150 a performance parameter may be performed by a signal processor. In other embodiments, determining 150 a performance parameter may be performed by another processor including, but not limited to, a general-purpose computer programmed as a signal processor or a processor of the multichannel signal generator (e.g., a VSA processor) programmed to provide performance parameter determination.

In some embodiments (not illustrated in FIG. 1), the method 100 of characterizing multichannel signal generator performance further comprises modulating subcarriers of the first and second subcarrier sets of the OFDM digital modulation using one or both of an amplitude modulation and a phase modulation. Modulating the subcarriers may be performed after the subcarriers have been generated 110, 120, but prior to combining 130. For example, the multichannel signal generator may perform the amplitude/phase modulation. In particular, subcarriers of the first and second subcarriers sets may be modulated using an analog random phase modulation. For example, subcarriers of the first subcarrier set may be modulated with a different analog random phase modulation than subcarriers of the second subcarrier set.

According to some embodiments, the subcarriers may be modulated using a predetermined random phase modulation (e.g., a unique phase value) for a symbol period that is about equal to an inverse of the spacing between subcarriers of the OFDM digital modulation. In general, as long as a subcarrier maintains a constant phase value for the symbol period equal to the subcarrier spacing, the subcarrier may be detected independently from other subcarriers of the OFDM digital modulation.

Further, in some embodiments, receiving and demodulating 140 of the method 100 of characterizing multichannel signal generator performance may comprise vector averaging of the received, combined signal. In particular, vector averaging may be applied prior to separating the combined signal into a representation of the first and second signals using signal processing, according to some embodiments.

Figure 3:
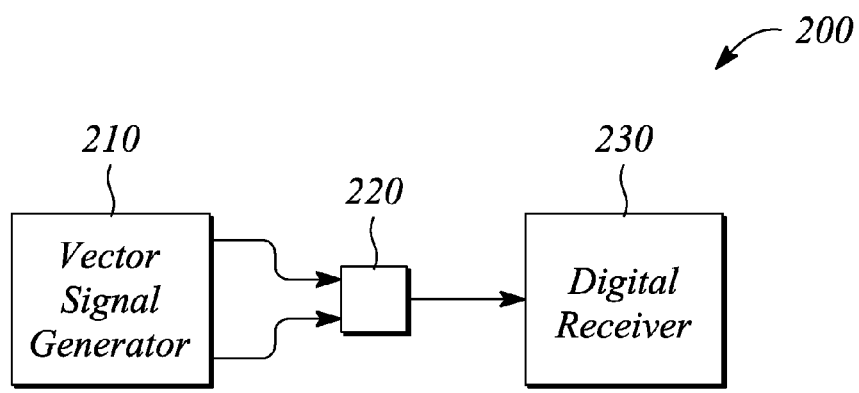
FIG. 3 illustrates a block diagram of a vector signal generator performance characterization system in an example, according to an embodiment consistent with the principles described herein.

In accordance with the principles described herein, a vector signal generator performance characterization system is provided. FIG. 3 illustrates a block diagram of a vector signal generator performance characterization system 200 in an example, according to an embodiment consistent with the principles described herein. As illustrated, the vector signal generator performance characterization system 200 comprises a vector signal generator (VSG) 210. According to various examples, the VSG 210 has a plurality of channels (e.g., 2 channels, 3 channels, 4 channels, or etc.), each channel being configured to produce or generate a signal. For example, the VSG 210 may be a 2-channel VSG having a first channel (e.g., channel A) and a second channel (e.g., channel B). The VSG 210 may be configured to produce a first signal in the first VSG channel and a second signal in the second VSG channel. In some embodiments, the VSG 210 may be substantially similar to the multichannel signal generator described above with respect to the method 100 of characterizing multichannel signal generator performance. For example, the VSG 210 may be a M9381A RF Vector Signal Generator manufactured by Keysight Technologies of Santa Rosa, Calif.

In particular, the first signal and the second signal comprise an orthogonal frequency-division multiplexing (OFDM) digital modulation, according to various embodiments. Further, a first set of subcarriers of the OFDM digital modulation are assigned to the first signal and a second set of subcarriers of the OFDM digital modulation are assigned to the second signal. In some embodiments, the first and second signals produced by the VSG 210 are substantially similar to the first signal generated 110 in a first channel of an multichannel signal generator and the second signal generated 120 in a second channel of an multichannel signal generator, as described above with respect to the method 100 of characterizing multichannel signal generator performance.

For example, in some embodiments, the VSG 210 may be configured to produce or generate the first and second signals comprising the OFDM digital modulation in which the first signal subcarrier set is interleaved with the second signal subcarrier subset. Further, a subcarrier of the first subcarrier set may be separated from a subcarrier of the second subcarrier set by an unused subcarrier, according to some embodiments. In addition, negative frequency subcarriers of the first and second subcarrier sets may be offset from corresponding positive frequency subcarriers. Further, a selected pair of adjacent subcarriers of the OFDM digital modulation are assigned to either the first VSG channel or the second VSG channel or respective selected pairs of adjacent subcarriers are assigned to both the first VSG channel and the second VSG channel, in some embodiments. The same channel-assigned adjacent subcarriers may be employed to facilitate unwrapping phase, as described above, for example.

As illustrated in FIG. 3, the vector signal generator performance characterization system 200 further comprises a power combiner 220. The power combiner 220 is connected to outputs of the first and second VSG channels to receive and combine the first and second signals as a combined signal. According to some embodiments, the power combiner 220 may be configured to combine the first and second signals in a manner that is substantially similar to combining 130 the first signal and the second signal to produce a combined signal, as described above with respect to the method 100 of characterizing multichannel signal generator performance. In particular, the power combiner 220 may comprise a passive, equal weighted, power combiner. For example, the power combiner 220 may be a Keysight 11636B Power Divider manufactured by Keysight Technologies of Santa Rosa, Calif.

The vector signal generator performance characterization system 200 illustrated in FIG. 3 further comprises a digital receiver 230. As illustrated, the digital receiver 230 is connected to an output of the power combiner 220. The digital receiver 230 is configured to receive and demodulate the combined signal. Receiving and demodulating the combined signal by the digital receiver 230 may be substantially similar to receiving and demodulating 140 of the method 100 of characterizing multichannel signal generator performance, according to some embodiments. In particular, the digital receiver 230 is configured to receive and demodulate the combined signal to facilitate characterization of a relative performance of the first and second VSG channels, according to various embodiments.

In some embodiments, the digital receiver 230 comprises a vector signal analyzer (VSA). In some embodiments, the VSA includes a single channel configured to receive and digitize the combined signal. For example, the VSA of the digital receiver 230 may be a single channel VSA. In another example, a single channel of a multichannel VSA may be employed as or in the digital receiver 230. In various examples (not illustrated), each channel of the VSG 210 and the channel of the VSA or more generally the digital receiver 230, may be connected to a common (i.e., the same) reference source such that all clock frequencies are locked. The reference source may be a ten-megahertz (10 MHz) reference source, for example.

According to some embodiments, the digital receiver 230 includes a signal processor. The signal processor may be configured to compute or otherwise determine one or more of a relative time delay, a relative carrier phase, a relative gain and a relative flatness of the first and second VSG channels from the received and demodulated combined signal. In some embodiments, the signal processor may receive a digitized representation of the combined signal. For example, the signal processor may receive an output of the VSA of the digital receiver 230. In some embodiments, computation or determination performed by the signal processor is substantially similar to determining 150 a performance parameter of the second channel relative to the first channel from the received and demodulated combined signal, as described above with respect to the method 100 of characterizing multichannel signal generator performance. Examples of VSAs that may be used as or in the digital receiver 230 include, but are not limited to, an M9391 RF Vector Signal Analyzer, an M9393 Microwave Signal Analyzer, an N9020A MXA Signal Analyzer, an N9030A PXA Signal Analyzer, and an N9040A UXA Signal Analyzer, each of which is manufactured by Keysight Technologies of Santa Rosa, Calif.

Figure 4:
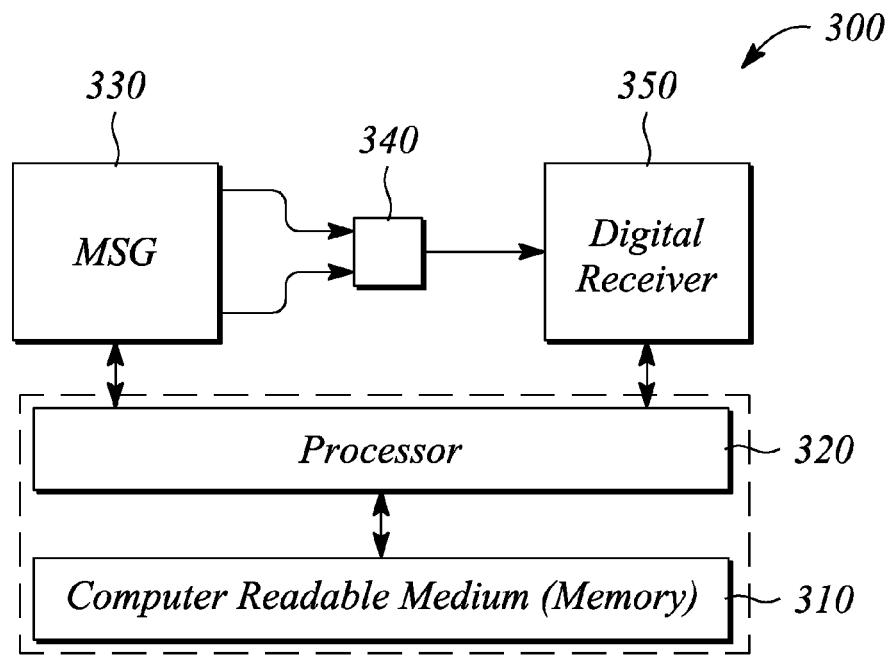
FIG. 4 illustrates a block diagram of a vector signal generator performance characterization system in an example, according to another embodiment consistent with the principles described herein.

According to some embodiments of the principles described herein, a non-transitory computer readable medium is provided. In particular, the non-transitory computer readable medium is encoded with instructions that, when executed by a processor, implement multichannel signal generator channel performance characterization, according to various embodiments. FIG. 4, described below, illustrates an example of the non-transitory computer readable medium 310. According to some embodiments, the multichannel signal generator channel performance characterization encoded in the instructions of the non-transitory computer readable medium may be substantially similar to the method 100 of characterizing described above.

In particular, the encoded instructions that implement multichannel signal generator channel performance characterization comprise generating a first signal in a first channel of a multichannel signal generator and generating a second signal in a second channel of the multichannel signal generator. According to various embodiments, the first and second signals comprise an orthogonal frequency-division multiplexing (OFDM) digital modulation having a first set of subcarriers assigned to the first signal and a second set of subcarriers assigned to the second signal. The encoded instructions to implement multichannel signal generator channel performance characterization further comprise receiving and demodulating a combined signal according to the orthogonal modulation using a digital receiver. The combined signal comprises the first and second signals, according to various examples. Further, the encoded instructions to implement multichannel signal generator channel performance characterization comprise determining a performance parameter of the second channel relative to the first channel using the received and demodulated combined signal.

In accordance with some embodiments of the principles described herein, another vector signal generator performance characterization system is provided. FIG. 4 illustrates a block diagram of a vector signal generator performance characterization system 300 in an example, according to another embodiment consistent with the principles described herein. As illustrated in FIG. 4, the vector signal generator performance characterization system 300 comprises a non-transitory computer readable medium 310. The non-transitory computer readable medium 310 may be may be substantially any memory including, but not limited to, random access memory (RAM), read only memory (ROM), or a combination thereof. For example, the non-transitory computer readable medium may be part of a general-purpose computer (e.g., see discussion with respect to FIG. 5 below). The non-transitory computer readable medium 310 is encoded with instructions that, when executed by a processor, implement multichannel signal generator channel performance characterization. In some embodiments, the non-transitory computer readable medium 310 is substantially similar to the non-transitory computer readable medium described above. Further, the multichannel signal generator channel performance characterization implemented by the instructions encoded on the non-transitory computer readable medium 310 may be substantially similar to the method 100 of multichannel signal generator channel performance characterization, as described above.

As illustrated in FIG. 4, the vector signal generator performance characterization system 300 further comprises a processor 320. The processor 320 is configured to access (e.g., read) and to execute the instructions encoded on the non-transitory computer readable medium 310, according to various embodiments. The processor 320 may be substantially any processor including, but not limited to, a microprocessor or a processor of a general-purpose computer (e.g., see discussion with respect to FIG. 5 below). In some embodiments, the processor 320 may be further configured to control other elements of the vector signal generator performance characterization system 300 (e.g., other elements such as a multichannel signal generator 330 and a digital receiver 350, described below) to implement the multichannel signal generator channel performance characterization. In some embodiments, the processor 320 may be part of a memory of the general-purpose computer, for example. A dashed-line box in FIG. 4 illustrates the general-purpose computer, by way of example. In other examples, the processor 320 may be a processor of another element of the vector signal generator performance characterization system 300, e.g., a processor of the multichannel signal generator 330 or a processor of the digital receiver 350, described below.

The vector signal generator performance characterization system 300 further comprises a multichannel signal generator 330 and a power combiner 340, as illustrated in FIG. 4. According to some embodiments, the multichannel signal generator 330 is substantially similar to the multichannel signal generator described above with respect to either the method 100 of multichannel signal generator performance characterization or the VSG 210 of the vector signal generator performance characterization system 200, described above. In particular, according to some embodiments, the multichannel signal generator 330 comprises a vector signal generator (VSG) configured to generate a first signal and a second signal in respective ones of a first channel and a second channel of the VSG (e.g., under the control of the processor 320). Further, the first and second signals comprise an orthogonal frequency-division multiplexing (OFDM) digital modulation having a first set of subcarriers assigned to the first signal and a second set of subcarriers assigned to the second signal, according to various embodiments.

The power combiner 340 illustrated in FIG. 4 is configured to combine the first and second signals to produce a combined signal. Further, as illustrated, the power combiner 340 is connected to receive outputs of the first and second channels of the multichannel signal generator 330 (e.g., outputs of the first and second channels of the VSG). According to some embodiments, the power combiner 340 is substantially similar to the power combiner 220 described above with respect to the vector signal generator performance characterization system 200. Further, the power combiner 340 is configured to combine the first and second signals to produce the combined signal in a manner substantially similar to combining 130 the first signal and the second signal to produce a combined signal, as described above with respect to the method 100 of characterizing multichannel signal generator performance. For example, the power combiner 340 may comprise a passive, equal weighted, power combiner.

Further as illustrated in FIG. 4, the vector signal generator performance characterization system 300 comprises a digital receiver 350. According to some embodiments, the digital receiver 350 may be substantially similar to the digital receiver 230 of the vector signal generator performance characterization system 200, described above. In particular, in some embodiments, the digital receiver 350 may comprise a vector signal analyzer (VSA) connected to an output of the power combiner 340 and is configured to receive and digitize the combined signal. In some embodiments, the digital receiver 350 further includes a signal processor (e.g., the signal processor of the digital receiver 230). In particular, the signal processor may be configured to compute one or more of a relative time delay, a relative carrier phase, a relative gain and a relative flatness of the first and second VSG channels from the received and demodulated combined signal, according to some embodiments. In other embodiments, the processor 320 may be configured to provide the computation and serve as the above-mentioned signal processor. Further, as mentioned above, the processor 320 is connected to control one or both of the multichannel signal generator 330 and the digital receiver 350 (e.g., the VSA), according to the executed instructions.

Figure 5:
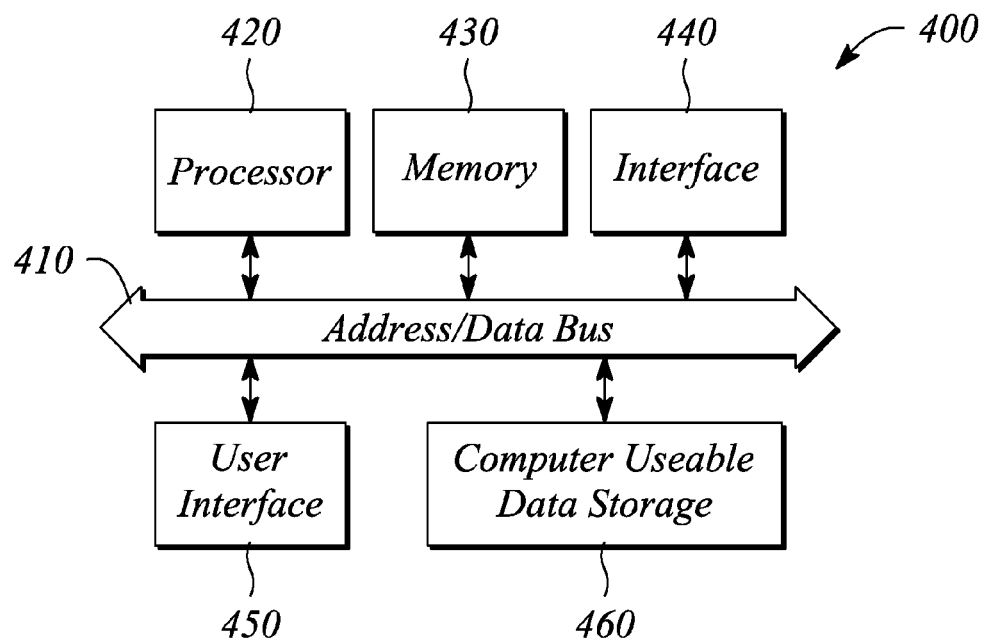
FIG. 5 illustrates a block diagram of a general-purpose computer in an example, according to an embodiment consistent with the principles described herein.

FIG. 5 illustrates a block diagram of a general-purpose computer 400 in an example, according to an embodiment consistent with the principles described herein. The general-purpose computer 400 may be configured to implement (e.g., using a computer program) the method 100 of multi-channel signal generator performance characterization, according to various embodiments. For example, a processor and memory of the general-purpose computer 400, described below, may be used as the processor 320 and the non-transitory computer readable medium 310, respectively, of the vector signal generator performance characterization system 300.

As illustrated in FIG. 5, the general-purpose computer 400 comprises an address/data bus 410. The address/data bus 410 is configured to communicate information between and among various constituent elements and modules of the general-purpose computer 400. The general-purpose computer 400 further comprises a processor 420. The processor 420 is coupled to the address/data bus 410 and is configured to process information and instructions (e.g., perform computations according to computer program instructions). In some embodiments, the processor 420 is a microprocessor. In other embodiments, the processor 420 may include, but is not limited to, a parallel processor, a signal processor, a virtual processor (e.g., cloud-based), an ASIC, an FPGA, or other hardware, as described above, for example.

According to various embodiments, the general-purpose computer 400 further comprises a memory 430. In particular, the memory 430 may be implemented as one or more data storage units coupled to the address/data bus 410. The memory 430 is configured to store information and instructions for use by the processor 420, for example. According to various embodiments, the memory 430, and more particularly the data storage units of the memory 430, may include, but are not limited to, random access memory (RAM), static RAM (SRAM), dynamic RAM (DRAM), or a combination thereof, that is coupled to the address/data bus 410. In some embodiments, the memory 430 includes or further includes substantially non-volatile memory such as, but not limited to, read-only memory (ROM), erasable programmable ROM (EPROM), electrically erasable programmable ROM (EEPROM), and flash memory. The substantially non-volatile memory may be coupled to the address/data bus 410 to provide non-volatile storage of information and instructions to be used by the processor 420, for example.

According to some embodiments, the processor 420 may be configured to one or both of execute instructions (e.g., a computer program) and employ data stored in a remote or online data storage unit such as in so-called 'cloud' computing. In these embodiments, the memory 430 may comprise the online data storage unit. According to some embodiments, the memory 430 may comprise a non-transitory computer readable medium and may include or be encoded with instructions (e.g., computer program instructions) that, when executed by the processor 420, implement multichannel signal generator performance characterization.

In some embodiments, the general-purpose computer 400 may further comprise an interface 440, as illustrated in FIG. 5. The interface 440 may be coupled to the address/data bus 410, for example. According to various embodiments, the interface 440 is configured to interface or communicate with other electronic devices and computer systems. According to various embodiments, the interface 440 may include various communications technology such as wired or wireline interfaces (e.g., serial cables, modems, network adapters, etc.) and wireless interfaces (e.g., WiFi and other wireless modems, wireless network adapters, etc.).

In some embodiments, the general-purpose computer 400 may further comprise a user interface 450 coupled to the address/data bus 410. The user interface 450 may include, but is not limited to, an input device (e.g., keyboard, mouse, track-pad, touch screen, etc.) configured to communicate information and commands from a user to the processor 420 and a display device configured to communicate information from the processor 420 to a user. According to various examples, the display device may include, but is not limited to, a cathode ray tube (CRT), a light emitting diode (LED) display, a liquid crystal display (LCD), a field emission display (FED), a plasma display, and substantially any other display device suitable for displaying information (e.g., video, alphanumeric data, etc.) to a user.

In some embodiments, the general-purpose computer 400 may further comprise computer useable data storage 460. According to some embodiments, the computer useable data storage 460 is coupled to the address/data bus 410 and is configured to store information including, but not limited to, computer executable instructions (e.g., a computer program). For example, the computer useable data storage 460 may comprise a non-transitory computer readable medium and may store or be encoded with instructions (e.g., stored computer program instructions) that, when executed by the processor 420, implement multichannel signal generator performance characterization, as described above. According to various embodiments, the computer useable data storage 460 may include, but is not limited to, a magnetic or optical disk drive, e.g., a hard disk drive (HDD), a floppy disk drive (FDD), a compact disc read-only memory (CD-ROM), a digital versatile disk (DVD), a thumb drive, etc. In some embodiments, the computer useable data storage 460 may include or further include, network attached storage, cloud storage, etc.

The general-purpose computer 400 described herein is an example of a computing environment that may be employed to implement embodiments of the present invention. However, implementation is not restricted to using a general-purpose computer 400, as illustrated in FIG. 5. For example, other computing systems and computing environments including, but not limited to, a virtual computing environment and various specialized processing systems may be employed. Further, according to some embodiments, one or more operations of various embodiments of the present invention may be controlled or implemented using computer-executable instructions, such as computer program modules, which are executed by a computer including, but not limited to, the general-purpose computer 400. According to some embodiments, such computer program modules may include routines, programs, object components and data structures configured to perform particular tasks or implement particular abstract data types, for example. In addition, some embodiments provide that one or more aspects of the present invention may be implemented by utilizing a distributed computing environment, such as where tasks are performed by remote processing devices that are linked through a communications network, or such as where various program modules are located in both local and remote computer-storage media including memory-storage devices, for example.

Thus, there have been described examples and embodiments of a method and systems of characterizing multichannel signal generator performance that employ orthogonal frequency-division multiplexing digital modulation to characterize a relative performance of channels of the multichannel signal generator. It should be understood that the above-described examples are merely illustrative of some of the many specific embodiments and examples that represent the principles described herein. Clearly, those skilled in the art can readily devise numerous other arrangements without departing from the scope as defined by the following claims.

What is claimed is:

1. A method of characterizing multichannel signal generator performance employing orthogonal modulation, the method comprising:
    generating a first signal in a first channel of a multichannel signal generator, the first signal comprising a first set of subcarriers of an orthogonal frequency-division multiplexing (OFDM) digital modulation;
    generating a second signal in a second channel of the multichannel signal generator, the second signal comprising a second set of subcarriers of the OFDM digital modulation;
    combining the first signal and the second signal to produce a combined signal;
    receiving and demodulating the combined signal according to the OFDM digital modulation using a digital receiver; and
    determining a performance parameter of the second channel relative to the first channel from the received and demodulated combined signal,
    wherein the first set of subcarriers excludes a subcarrier of the second set of subcarriers and the second set of subcarriers excludes a subcarrier of the first set of subcarriers,
    wherein during generating the first and second signals, a selected pair of the subcarriers of the first subcarrier set is configured to be frequency adjacent to one another without an intervening subcarrier of the second subcarrier set to facilitate unwrapping phase within the digital receiver.

2. The method of characterizing multichannel signal generator performance of claim 1, wherein the subcarriers of the first subcarrier set are interleaved with the subcarriers of the second subcarrier set where the subcarriers of the first subcarrier set alternate with the subcarriers of the second subcarrier set as a function of frequency.

3. The method of characterizing multichannel signal generator performance of claim 2, wherein a subcarrier of the first subcarrier set is separated from a subcarrier of the second subcarrier set by an unused subcarrier, and wherein negative frequency subcarriers of the first and second subcarrier sets are offset from corresponding positive frequency sub carriers.

4. The method of characterizing multichannel signal generator performance of claim 2, further comprising modulating the subcarriers of the first and second subcarrier sets using analog random phase modulation, wherein the subcarriers of the first subcarrier set have a different analog random phase modulation than an analog random phase modulation of the subcarriers of the second subcarrier set.

5. The method of characterizing multichannel signal generator performance of claim 1, wherein combining the first signal and the second signal comprises using a passive, equal weighted, power combiner having a pair of inputs to receive the first and second signals and an output configured to provide the combined signal.

6. The method of characterizing multichannel signal generator performance of claim 1, wherein the digital receiver comprises a vector signal analyzer (VSA) connected to receive the combined signal, and wherein the multichannel signal generator comprises a vector signal generator (VSG).

7. The method of characterizing multichannel signal generator performance of claim 1, further comprising vector averaging of the received, combined signal prior to separating the combined signal into a representation of the first and second signals using signal processing after the receiving and demodulating.

8. The method of characterizing multichannel signal generator performance of claim 1, wherein the determining the performance parameter comprises computing one or more of a relative time delay, a relative carrier phase, a relative gain and a relative flatness of the first and second channels of the multichannel signal generator from the received and demodulated combined signal.

9. A vector signal generator performance characterization system comprising:
a vector signal generator (VSG) configured to produce a first signal in a first VSG channel and a second signal in a second VSG channel, the first signal comprising a first set of subcarriers of an orthogonal frequency-division multiplexing (OFDM) digital modulation, the second signal comprising a second set of subcarriers of the OFDM digital modulation;
a power combiner connected to outputs of the first and second VSG channels to receive and combine the first and second signals into a combined signal; and
a digital receiver connected to an output of the power combiner, the digital receiver being configured to receive and demodulate the combined signal to facilitate characterization of a relative performance of the first and second VSG channels,
wherein the first set of subcarriers excludes a subcarrier of the second set of subcarriers and the second set of subcarriers excludes a subcarrier of the first set of subcarriers, and
wherein a selected pair of subcarriers of the first subcarrier set is configured by the VSG to be frequency adjacent to one another without an intervening subcarrier of the second subcarrier set and another selected pair of subcarriers of the second subcarrier set is configured by the VSG to be frequency adjacent to one another without an intervening subcarrier of the first subcarrier set to facilitate unwrapping phase within the digital receiver.

10. The vector signal generator performance characterization system of claim 9, wherein the first subcarrier set is interleaved with the second subcarrier set where the subcarriers of the first and second subcarrier sets respectively alternate with one another as a function of frequency.

11. The vector signal generator performance characterization system of claim 9, wherein a subcarrier of the first subcarrier set is separated from a subcarrier of the second subcarrier set by an unused subcarrier, and wherein negative frequency subcarriers of the first and second subcarrier sets are offset from corresponding positive frequency subcarriers.

12. The vector signal generator performance characterization system of claim 9, wherein the power combiner comprises a passive, equal weighted, power combiner.

13. The vector signal generator performance characterization system of claim 9, wherein the digital receiver comprises a vector signal analyzer (VSA) including a single channel configured to receive and digitize the combined signal.

14. The vector signal generator performance characterization system of claim 9, wherein the digital receiver includes a signal processor configured to compute one or more of a relative time delay, a relative carrier phase, a relative gain and a relative flatness of the first and second VSG channels from the received and demodulated combined signal.

15. The vector signal generator performance characterization system of claim 9, further comprising a common reference source connected to the digital receiver and connected to both the first VSG channel and the second VSG channel.

16. A non-transitory computer readable medium encoded with instructions that, when executed by a processor, implement multichannel signal generator performance characterization comprising:
generating a first signal in a first channel of a multichannel signal generator, the first signal comprising a first set of subcarriers of an orthogonal frequency-division multiplexing (OFDM) digital modulation;
generating a second signal in a second channel of the multichannel signal generator, the second signal comprising a second set of subcarriers of the OFDM digital modulation;
receiving and demodulating a combined signal according to the OFDM digital modulation using a digital receiver, the combined signal comprising the first and second signals; and
determining a performance parameter of the second channel relative to the first channel using the received and demodulated combined signal,
wherein the first set of subcarriers excludes a subcarrier of the second set of subcarriers and the second set of subcarriers excludes a subcarrier of the first set of subcarriers, and
wherein during generating the first and second signals, a selected pair of the subcarriers of the first subcarrier set is configured to be frequency adjacent to one another without an intervening subcarrier of the second subcarrier set to facilitate unwrapping phase within the digital receiver.

17. The non-transitory computer readable medium of claim 16, wherein the first subcarrier set is interleaved with the second subcarrier set where the subcarriers of the first subcarrier set alternate with the subcarriers of the second subcarrier set as a function of frequency, and wherein a subcarrier of the first subcarrier set is separated from a subcarrier of the second subcarrier set by an unused subcarrier, and wherein negative frequency subcarriers of the first and second subcarrier sets are offset from corresponding positive frequency subcarriers.

18. A vector signal generator performance characterization system comprising the non-transitory computer readable medium of claim 16, the vector signal generator performance characterization system further comprising:
- the processor configured to execute the instructions encoded on the non-transitory computer readable medium;
- the multichannel signal generator comprising a vector signal generator (VSG) configured to generate the first and second signals in first and second channels of the VSG;
- a power combiner configured to combine the first and second signals to produce the combined signal; and
- the digital receiver comprising a vector signal analyzer (VSA) connected to an output of the power combiner and configured to receive and digitize the combined signal,
- wherein the processor is connected to control one or both of the multichannel signal generator and the digital receiver, according to the executed instructions.

* * * * *